(12) United States Patent
Liu

(10) Patent No.: US 8,252,616 B2
(45) Date of Patent: Aug. 28, 2012

(54) PACKAGE STRUCTURE OF PHOTODIODE AND FORMING METHOD THEREOF

(75) Inventor: Tai-Hui Liu, Hukou Shiang (TW)

(73) Assignee: Solapoint Corporation, Hukou Shiang (TW)

( * ) Notice: Subject to any disclaimer, the term of this patent is extended or adjusted under 35 U.S.C. 154(b) by 0 days.

(21) Appl. No.: 12/905,002

(22) Filed: Oct. 14, 2010

(65) Prior Publication Data
US 2011/0092023 A1    Apr. 21, 2011

(30) Foreign Application Priority Data
Oct. 16, 2009  (TW) .................................. 98135054

(51) Int. Cl.
*H01L 21/00*    (2006.01)
(52) U.S. Cl. .......... 438/64; 438/122; 257/433; 257/712; 257/E31.131; 257/E23.08
(58) Field of Classification Search .................... 438/66; 257/E23.08
See application file for complete search history.

(56) References Cited

U.S. PATENT DOCUMENTS

| | | | | |
|---|---|---|---|---|
| 4,868,349 A * | 9/1989 | Chia | .............................. | 174/526 |
| 5,688,408 A * | 11/1997 | Tsuru et al. | ...................... | 216/17 |
| 2004/0005119 A1 * | 1/2004 | Han et al. | ......................... | 385/49 |
| 2005/0141823 A1 * | 6/2005 | Han et al. | ......................... | 385/89 |
| 2006/0138621 A1 * | 6/2006 | Bogner et al. | ................ | 257/678 |
| 2010/0201280 A1 * | 8/2010 | McKenzie et al. | ............ | 315/246 |

* cited by examiner

*Primary Examiner* — Michelle Mandala
*Assistant Examiner* — Shaka Scarlett
(74) *Attorney, Agent, or Firm* — Liu & Liu

(57) ABSTRACT

A package structure of photodiode and a forming method of the same are provided. The method includes providing a heat-dissipation plate; placing a circuit board on the heat-dissipation plate, the circuit board having an opening exposing a top surface of the heat-dissipation plate and a first contact pad located on a peripheral area of the opening; placing a carrier with a metal cladding surface into the opening, the carrier connecting the top surface of the heat-dissipation plate; placing a photodiode chip on the carrier wherein the bottom area of the photodiode chip is less than the metal cladding surface such that a portion of the metal cladding surface is exposed; and electrically connecting the exposed metal cladding surface to the first contact pad.

20 Claims, 14 Drawing Sheets

PACKAGE STRUCTURE OF PHOTODIODE AND FORMING METHOD THEREOF

BACKGROUND OF THE INVENTION

1. Field of the Invention

The present invention relates to photodiodes, and more particularly, to a package structure of photodiode having a submount.

2. Description of Related Art

FIG. 5 shows a conventional package structure of photodiode 500. As shown in the drawing, the package structure of photodiode 500 comprises a heat-dissipation plate 510, a circuit board 520, and a photodiode chip 530. The circuit board 520 has a first electrical contact 521 and a second electrical contact 522. The photodiode chip 530 has two electrodes of different electricity, namely an N-type electrode and a P-type electrode. The N-type electrode and the P-type electrode are disposed on two opposing sides of the photodiode chip 530, respectively. The P-type electrode is in electrical contact with the second electrical contact 522. The N-type electrode is electrically connected to the first electrical contact 521 via a wire 540. The photodiode chip 530 is coated with an encapsulant 550 to finalize the package.

The conventional package structure of photodiode has drawbacks, that is, an intricate process and a high manufacturing cost. Hence, it is imperative to provide a novel package structure and fabrication method of photodiode to solve the known problems.

BRIEF SUMMARY OF THE INVENTION

In one aspect, the present invention provides a method of forming a package structure of photodiode, the method comprising: providing a heat-dissipation plate; placing a circuit board on the heat-dissipation plate, the circuit board including: an opening exposing a top surface of the heat-dissipation plate; and a first contact pad located on a peripheral area of the opening; placing a carrier having a metal cladding surface into the opening; placing a photodiode chip on the carrier, wherein the bottom area of the photodiode chip is less than the area of the metal cladding surface such that a portion of the metal cladding surface is exposed; and electrically connecting the exposed metal cladding surface to the first contact pad.

In another aspect, the present invention provides a method of forming a package structure of photodiode, the method comprising: providing a heat-dissipation plate; placing a circuit board on the heat-dissipation plate, the circuit board having an opening exposing a top surface of the heat-dissipation plate and a first contact pad located on a peripheral area of the opening; providing a photodiode submount, the photodiode submount including: a carrier having a metal cladding surface; and a photodiode chip on the carrier, wherein the bottom area of the photodiode chip is less than the area of the metal cladding surface such that a portion of the metal cladding surface is exposed; placing the photodiode submount into the opening; and electrically connecting the exposed metal cladding surface to the first contact pad.

In yet another aspect, the present invention provides a package structure of photodiode, comprising: a heat-dissipation plate; a circuit board on the heat-dissipation plate, the circuit board having an opening exposing a top surface of the heat-dissipation plate and a first contact pad located on a peripheral area of the opening; a photodiode submount placed in the opening and attached onto the top surface of the heat-dissipation plate, the photodiode submount including: a carrier having a metal cladding surface; and a photodiode chip on the carrier, the bottom area of the photodiode chip being less than the area of the metal cladding surface such that a portion of the metal cladding surface is exposed, wherein the exposed metal cladding surface is electrically connected to the first contact pad through wire bonding.

In a further aspect, the present invention provides a package structure of photodiode, comprising: a heat-dissipation plate; a circuit board on the heat-dissipation plate, the circuit board having an opening exposing a top surface of the heat-dissipation plate and a first contact pad and a second contact pad located on a peripheral area of the opening; a photodiode submount placed in the opening and attached onto the top surface of the heat-dissipation plate, the photodiode submount including: a carrier having a metal cladding surface; and a photodiode chip on the carrier, the bottom area of the photodiode chip being less than the area of the metal cladding surface such that a portion of the metal cladding surface is exposed; and a lead frame, wherein the exposed metal cladding surface is electrically connected to the first contact pad through the lead frame, and the second contact pad is electrically connected to the photodiode chip through the lead frame.

DETAILED DESCRIPTION OF THE INVENTION

Preferred embodiments of the present invention are hereunder illustrated with the accompanying drawings. The similar elements in the accompanying drawings employ the same numeral references. It should be noted that in order to clearly illustrate the present invention, each element in the accompanying drawings are not drawn to scale as the actual object. Also, in order to avoid obscuring the content of the present invention, the conventional components, related material and related processing techniques are omitted in the followed description.

Figure 1A:
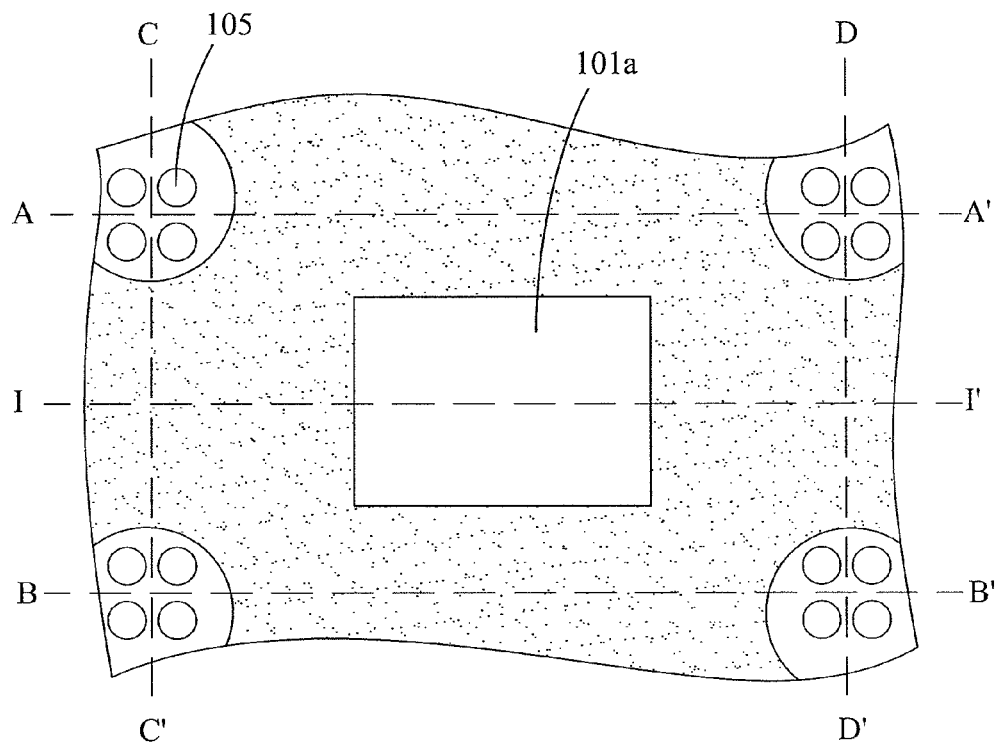
FIGS. 1A, 1A', 1B, 1B', 1C, 1D, 1E, 1F, 1G and 1H are schematic diagrams related to the steps in the fabrication process of a package structure of photodiode according to a first embodiment of the present invention.
Figure 1A:
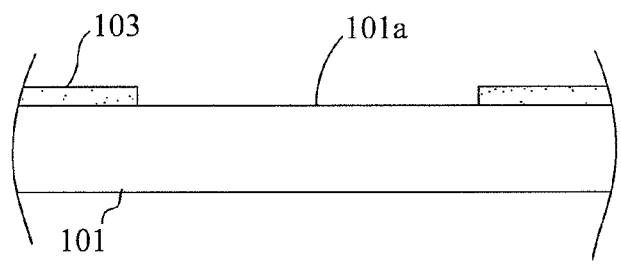

FIGS. 1A, 1A', 1B, 1B', 1C, 1D, 1E, 1F, 1G and 1H are schematic diagrams related to the steps in the fabrication process of a package structure of photodiode 100 according to a first embodiment of the present invention. Among the diagrams, FIGS. 1A, 1B and 1G are top views, and the remaining diagrams are cross-sectional views taken along dashed line I-I'.

Referring to FIGS. 1A and 1A', a heat-dissipation plate 101 is provided, and then a patterned solder layer 103 is formed on the heat-dissipation plate 101. The patterned solder layer 103 is for connecting the heat-dissipation plate 101 and a circuit board to be formed thereon. In this embodiment, the heat-dissipation plate 101 is a substrate in a large dimension and is suitable for use in fabrication of a plurality of package structures of photodiodes 100. Dashed lines A-A', B-B', C-C', and D-D' in FIG. 1A define the predetermined regions for the package structures of photodiodes 100, respectively. The heat-dissipation plate 101 is made of any material of a high heat conductivity, such as copper, aluminum, or any appropriate material. A plurality of holes 105 are formed on the heat-dissipation plate 101 in advance and configured to engage with an external component. A solder layer 103 is made of ordinary solder paste or any other appropriate material, and is patterned by printing or by any other appropriate means. The solder layer 103 thus patterned exposes a top surface 101a of the heat-dissipation plate 101.

Figure 1B:
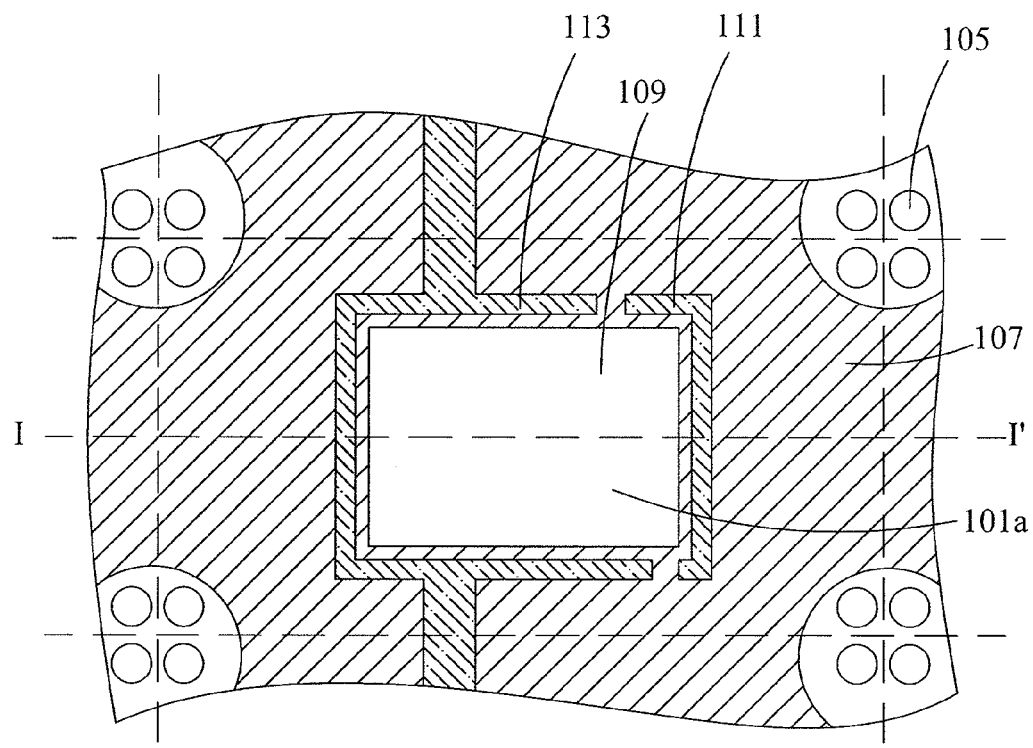
Figure 1B:
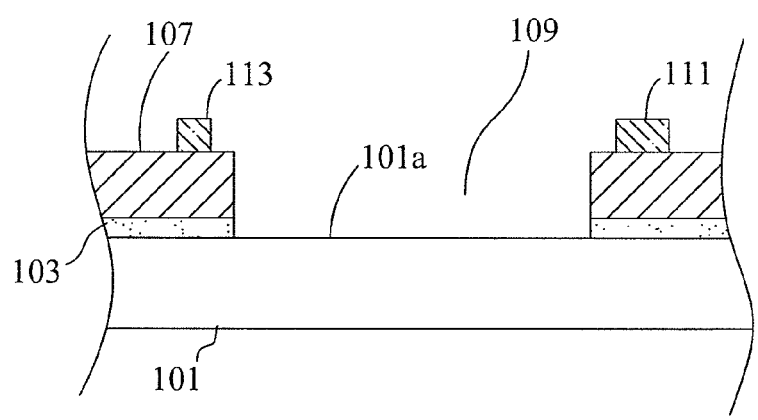

Referring to FIGS. 1B and 1B', a circuit board 107 is placed on the solder layer 103 and the heat-dissipation plate 101. The circuit board 107 is previously formed with an opening 109 for exposing the top surface 101a of the heat-dissipation plate 101. Furthermore, the circuit board 107 is previously formed with a first contact pad 111 and a second contact pad 113 to be located on a peripheral area of the opening 109. The purpose of disposing the first contact pad 111 and the second contact pad 113 on a peripheral area of the opening 109 is to facilitate a subsequent process of electrical connection with a chip. In this embodiment, the circuit board 107 is a monolayer circuit board; but the circuit board of the present invention is not limited thereto. For instance, the circuit board 107 can also be a double-sided circuit board or a multilayer circuit board formed therein with a buried via or a blind via. The circuit board 107 is made of glass fiber epoxy resin, copper, aluminum, or low temperature co-fired ceramic (LTCC).

Figure 1C:
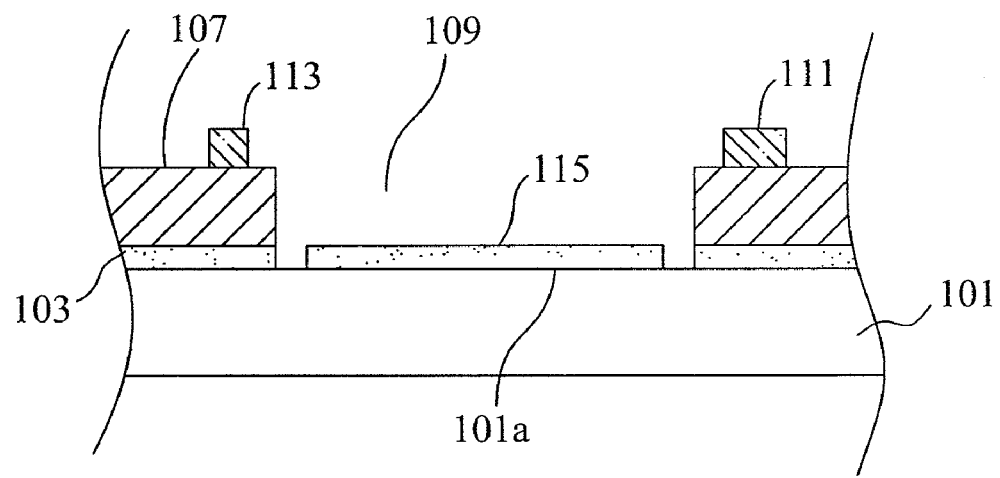

Referring to FIG. 1C, a first solder sheet 115 is placed into the opening 109 and positioned on the top surface 101a of the heat-dissipation plate 101. The first solder sheet 115 is made of tin or any other appropriate material, and is configured to connect the heat-dissipation plate 101 and a carrier to be placed thereon.

Figure 1D:
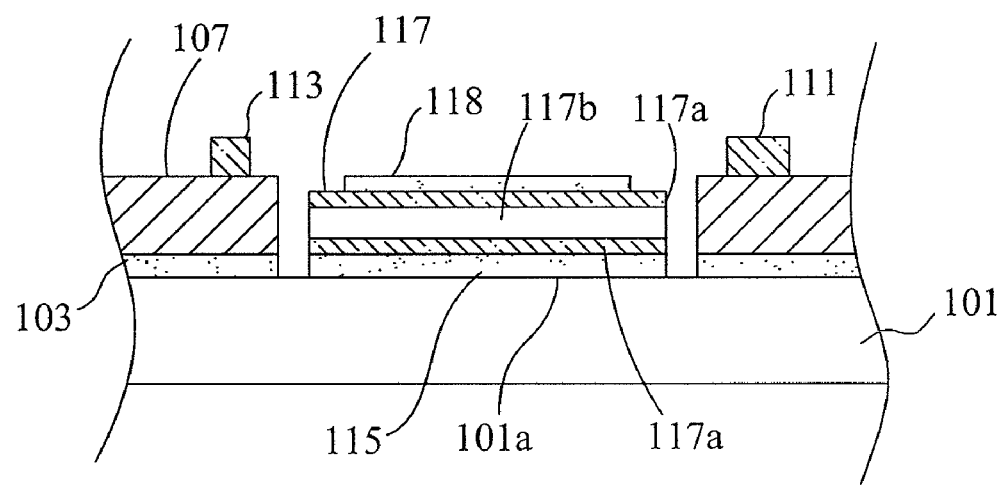

Referring to FIG. 1D, a carrier 117 is placed into the opening 109 such that the carrier 117 is connected to the top surface 101a of the heat-dissipation plate 101 through the first solder sheet 115. In this embodiment, the carrier 117 has a metal cladding surface 117a. For example, the carrier 117 is a direct bond copper (DBC) substrate. A direct bond copper (DBC) substrate is fabricated by forming copper layers on the surfaces of a ceramic substrate under a eutectic process carried out at high temperature. The ceramic substrate is made of aluminum oxide ($Al_2O_3$), aluminum nitride (AlN) or others. In general, a direct bond copper (DBC) substrate is divided into three layers, namely a upper copper foil 117a, a ceramic layer 117b configured for heat dissipation and insulation, and a lower copper foil 117a in a top-to-bottom order. A direct bond copper (DBC) substrate is characterized in high endurance against mechanical stress, stable shape, a low likelihood of separation of copper and ceramic, and high thermal conductivity. As shown in the drawing, a second solder sheet 118 is placed into the opening 109 and positioned above the carrier 117. The second solder sheet 118 is made of tin or any appropriate material and configured to connect the carrier 117 and a chip subsequently disposed. The dimensions of the second solder sheet 118 match that of a chip for use therewith. In this embodiment, the dimensions of the second solder sheet 118 are less than that of the top surface of the carrier 117, and thus that a portion of the metal cladding surface 117a is exposed when the second solder sheet 118 is positioned above the carrier 117.

Figure 1E:
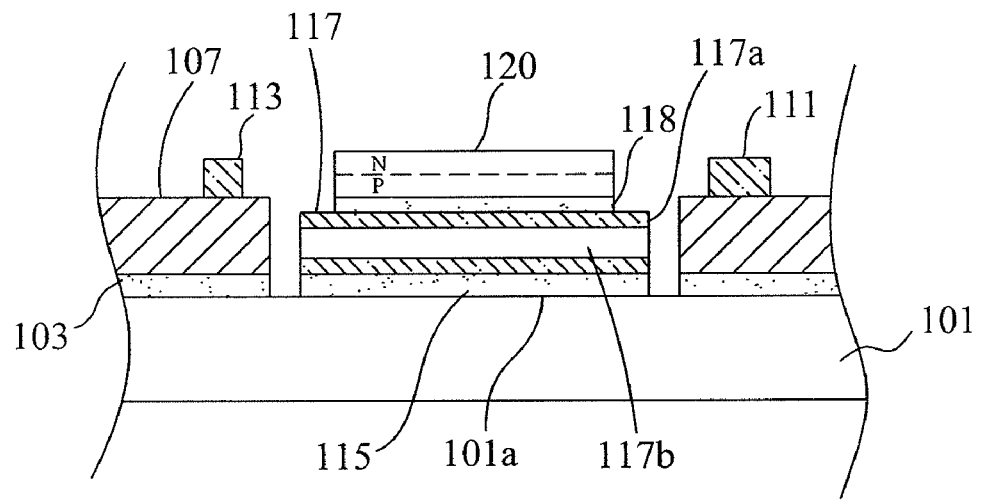

Referring to FIG. 1E, a photodiode chip 120 is placed on the second solder sheet 118. In this embodiment, the N-electrode and the P-electrode of the photodiode chip 120 are located on the upper and lower sides of the chip, respectively, though the present invention is not limited to the aforesaid technical feature. The bottom area of the photodiode chip 120 is less than the area of the metal cladding surface 117a such that a portion of the metal cladding surface 117a is exposed. After the photodiode chip 120 has been placed on the carrier 117, a single reflow process is performed to enable the patterned solder layer 103, the first solder sheet 115, and the second solder sheet 118 to melt at the same time; meanwhile, the heat-dissipation plate 101 is connected to the circuit board 107 and the carrier 117, while the photodiode chip 120 is connected to the carrier 117. The single reflow process can be a vacuum reflow at 240° C. and 0.01 torr.

Figure 1F:
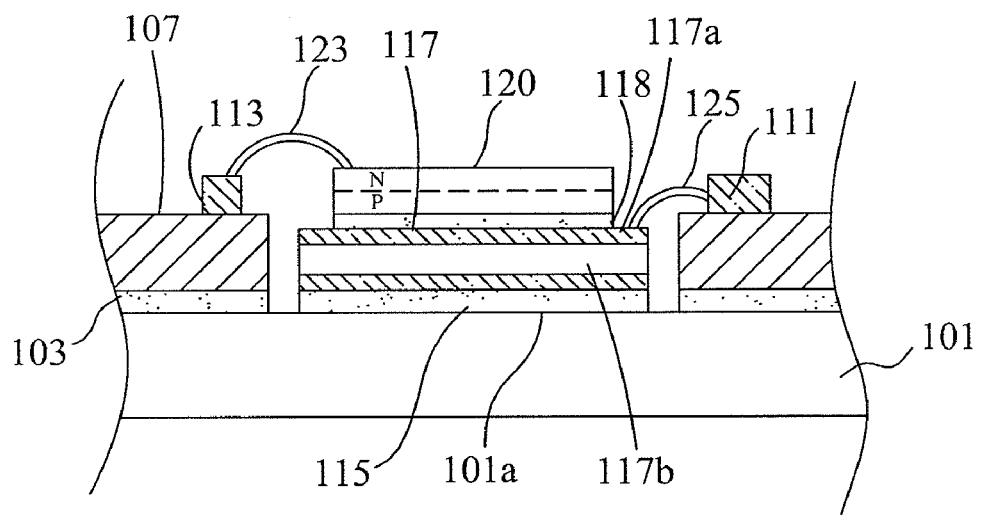
Figure 1G:
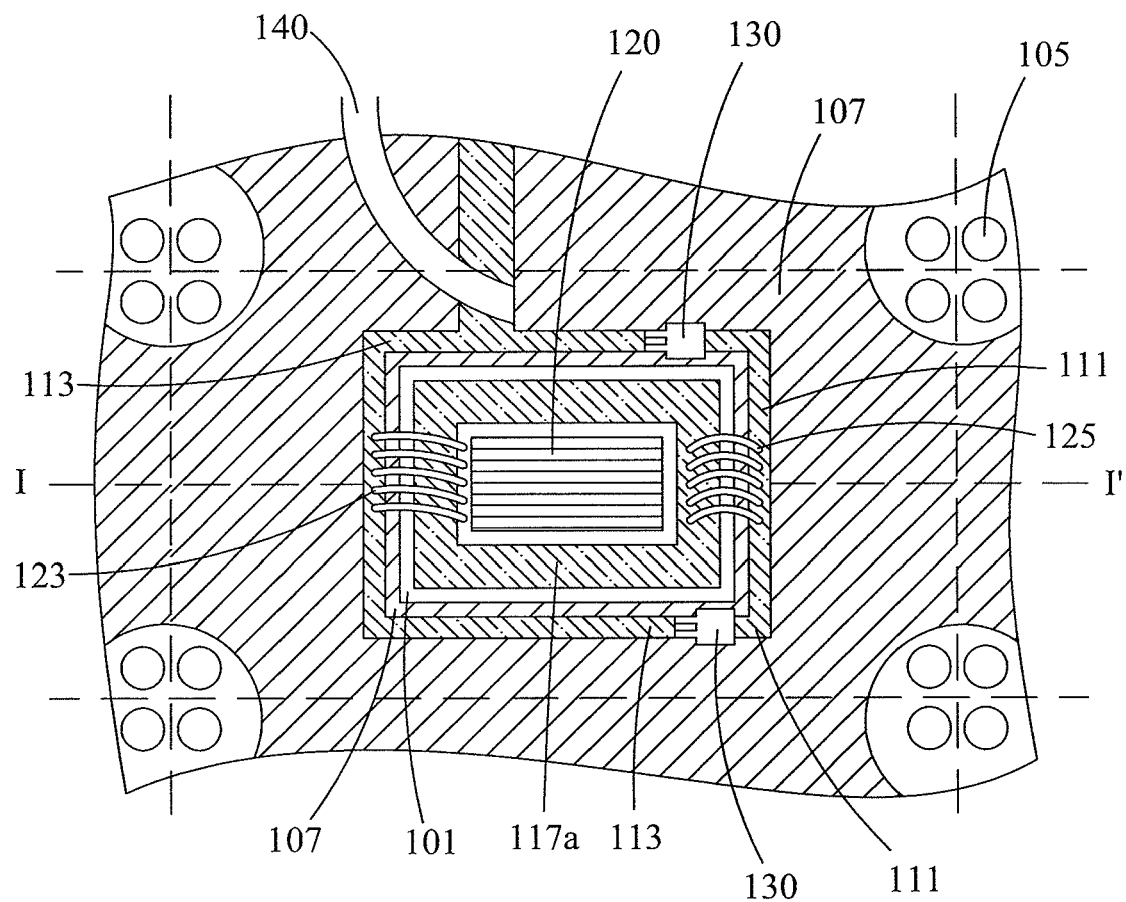

Referring to FIG. 1F, a wire bonding process is performed to form gold wires 123, 125. The formation of gold 125 allows the exposed metal cladding surface 117a connected to the first contact pad 111 and thereby further electrically connected to the P-electrode. The formation of gold 123 allows the second contact pad 113 connected to the N-electrode of the photodiode chip. In this embodiment, a gold wire bonding process conducts the electrical connection step, though the present invention is not limited thereto. In addition to the gold wire bonding process, electrical connection can be performed by any other appropriate connection means, such as wedge bonding, a metal bump, or a lead frame.

Upon completion of the aforesaid electrical connection process, it is feasible to selectively perform a solder resist ink coating process on any appropriate surface (not shown) of the structure shown in FIG. 1F, and then perform the step illustrated in FIG. 1G. Referring to FIG. 1G, a protective diode 130 is placed on the circuit board 107, and the protective diode 130 is electrically connected to the first contact pad 111 and the second contact pad 113. In addition to the protective diode 130, other parts and components, such as a connector 140, can be disposed on the surface of the structure shown in FIG. 1G. Afterward, another reflow process is performed at 200° C., so as to finalize the soldering of the aforesaid parts and components, such as the protective diode 130 and the connector 140.

Figure 1H:
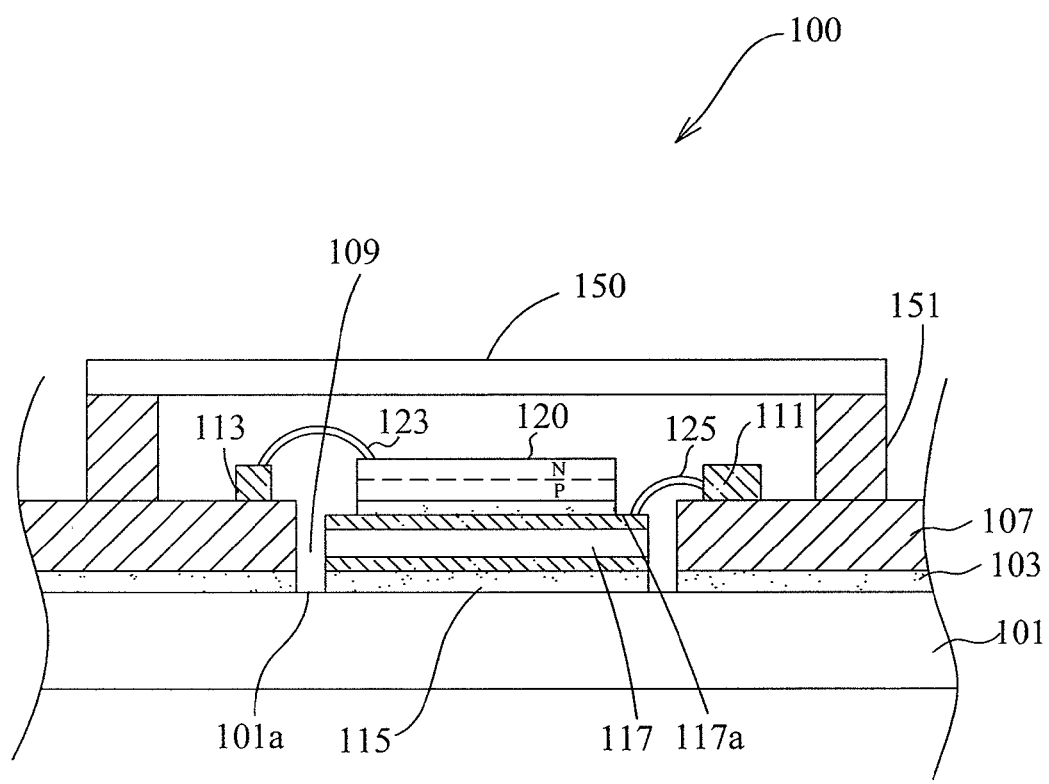

Referring to FIG. 1H, a transparent glass plate 150 is disposed above the structure shown in FIG. 1G to protect the aforesaid electronic components, especially the protective diode 130. The transparent glass plate 150 is coated with an anti-reflection material. The transparent glass plate 150 has a supportive post 151 extending downward therefrom, which can be formed on the circuit board 107 in advance. The supportive post 151 is a transparent adhesive, such as EVA (Ethylene-Vinyl Acetate copolymer).

FIG. 1H is a schematic diagram of the package structure of photodiode 100 in the first embodiment. As shown in the diagram, the package structure of photodiode 100 comprises: the heat-dissipation plate 101; the circuit board 107 connected to the heat-dissipation plate 101, wherein the circuit board 107 has an opening 109 for exposing a top surface 101a of the heat-dissipation plate 101; and the first contact pad 111 and the second contact pad 113 are disposed on a peripheral area of the opening 109. The photodiode chip 120 and the carrier 117 thereof are disposed in the opening 109, and are connected to the top surface 101a of the heat-dissipation plate 101. The carrier 117 has a metal cladding surface 117a. The photodiode chip 120 is disposed on the carrier 117. The bottom area of the photodiode chip 120 is less than the area of the metal cladding surface 117a, so as for a portion of the metal cladding surface 117a to be exposed. The exposed metal cladding surface 117a is electrically connected to the first contact pad 111 through the gold wire 125. The photodiode chip 120 is electrically connected to the second contact pad 113 through the gold wire 123. The transparent glass plate 150 is disposed above the circuit board 107.

Figure 2A:
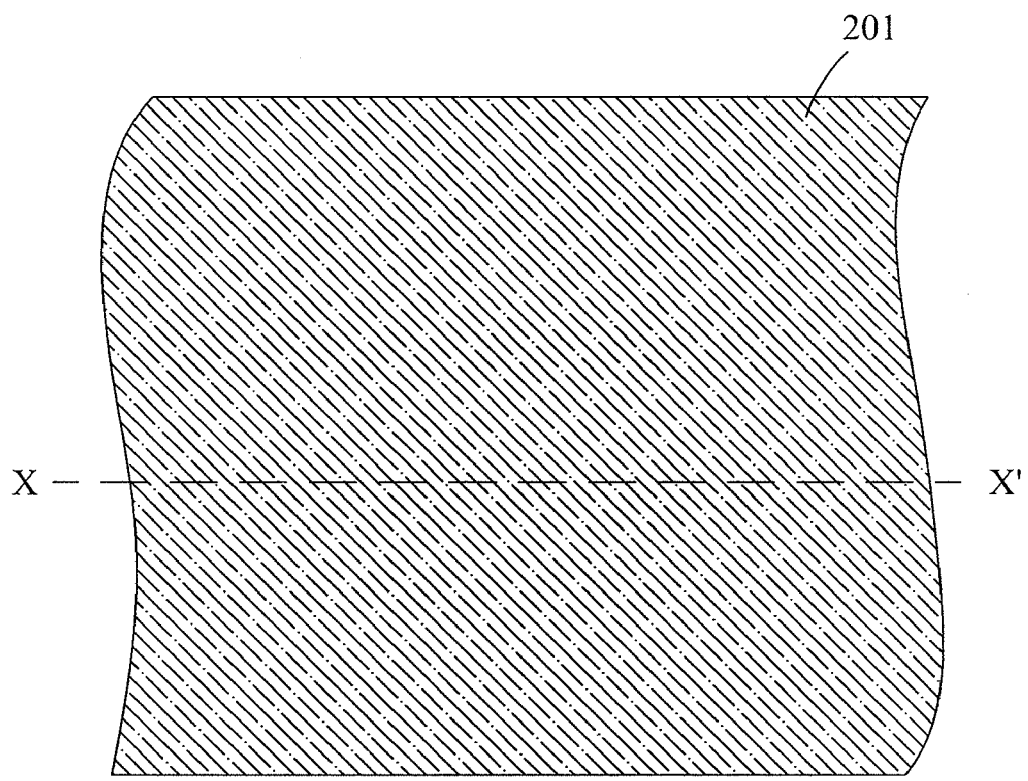
FIGS. 2A, 2A', 2B, 2B', 2C, 2C' and 2D are schematic diagrams related to the steps in the fabrication process of a package structure of photodiode according to a second embodiment of the present invention.
Figure 2A:
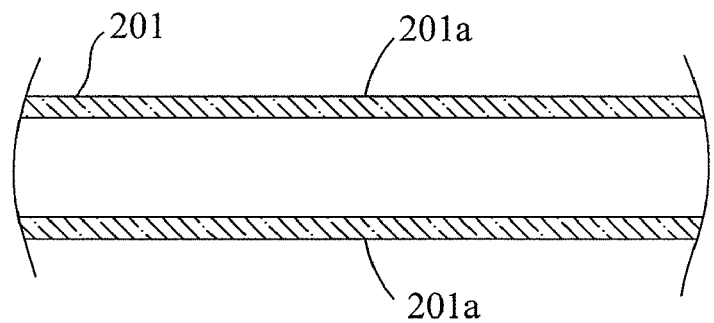
Figure 2B:
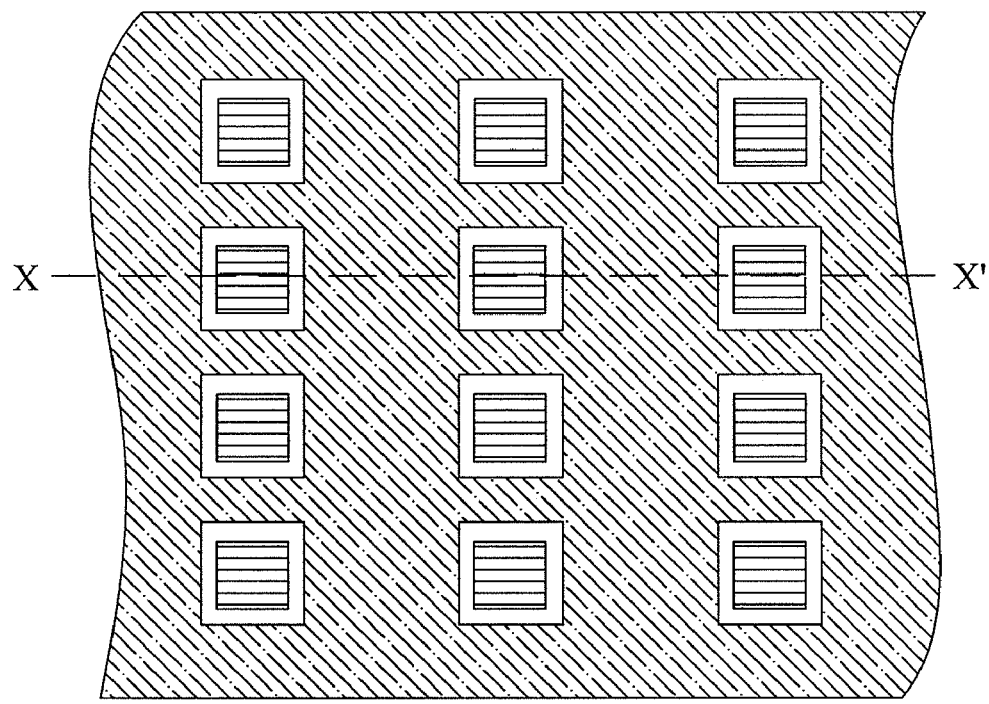
FIGS. 2E and 2F are top views of an embodiment of electrically connecting a photodiode and a circuit board by a wire bonding process according to the present invention.
Figure 2B:
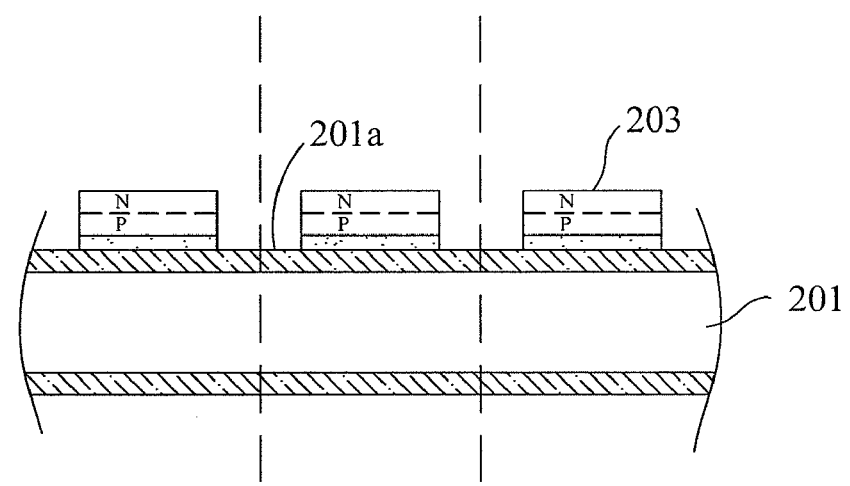
Figure 2C:
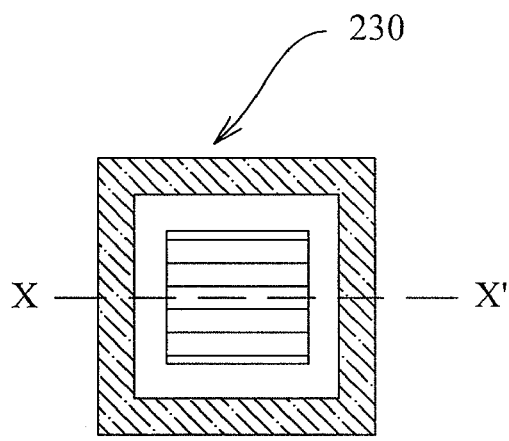
Figure 2C:
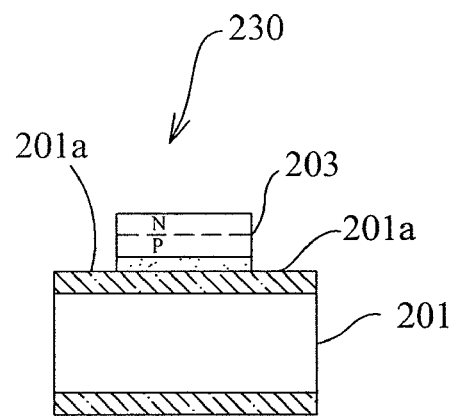

FIGS. 2A, 2A', 2B, 2B', 2C, 2C', and 2D are schematic diagrams related to the steps in the fabrication process of a package structure of photodiode 200 according to a second embodiment of the present invention. FIGS. 2A, 2B, and 2C are top views, and the other diagrams are cross-sectional views taken along dashed line X-X'. The second embodiment differs from the first embodiment in the following ways: the first embodiment involves disposing separately a carrier and a photodiode chip on the heat-dissipation plate; and the second embodiment involves coupling a photodiode chip and a carrier together to form a photodiode submount before disposing the photodiode submount on the heat-dissipation plate. The second embodiment has the following advantage: the photodiode submount thus formed can be examined by x-ray or any other appropriate optical instrument to verify the satisfactory quality of the photodiode submount, before the photodiode submount is disposed on the heat-dissipation plate.

Figure 2D:
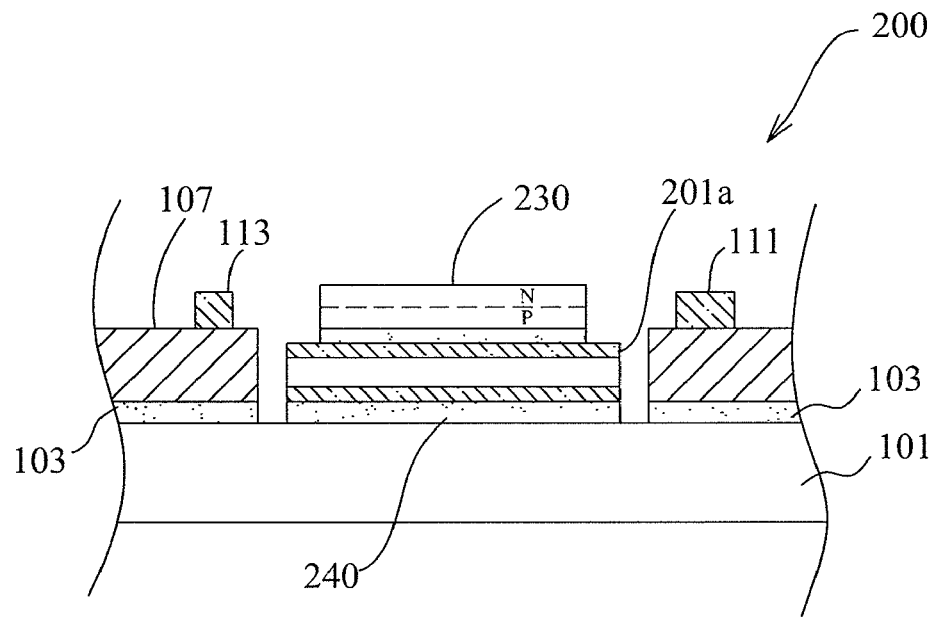

Referring to FIGS. 2A and 2A', a carrier 201 is provided. In this embodiment, the carrier 201 is of large dimensions and thus fit for use in concurrent fabrication of a plurality of photodiode submounts. The carrier 201 has a metal cladding surface 201a. For example, the carrier 201 is a direct bond copper (DBC) substrate, as mentioned above. Then, referring to FIGS. 2B and 2B', a plurality of photodiode chips 203 are formed at predetermined positions of the carrier 201. Then, the carrier 201 is cut to form a plurality of photodiode submounts 230. The structures of the photodiode submounts 230 are shown in FIGS. 2C and 2C', respectively, wherein the photodiode chip 203 is disposed on the carrier 201, and the bottom area of the photodiode chip 203 is less than the area of the metal cladding surface 201a such that a portion of the metal cladding surface 201a is exposed. Then, referring to FIG. 2D, the photodiode submount 230 is placed in the opening 109 of the structural assembly of the heat-dissipation plate 101 and a circuit board 207 in the first embodiment shown in FIG. 1B, so as to form the package structure of photodiode 200 shown in FIG. 2D. It is feasible to place the photodiode submount 230 in the opening 109 after a solder sheet 240 has been placed in the opening 109. The solder sheet 240 enables the photodiode submount 230 to attach to the heat-dissipation plate 101. Upon completion of the step shown in FIG. 2D regarding the second embodiment, it is appropriate to continue with the step shown in FIG. 1F regarding the first embodiment, so as to finalize the electrical connection of the photodiode submount 230 and the circuit board. In other words, in the package structure of photodiode 200 of the second embodiment, the electrical connection of the photodiode submount 230 and the circuit board is conducted by a wire bonding process illustrated with the first embodiment.

Figure 2E:
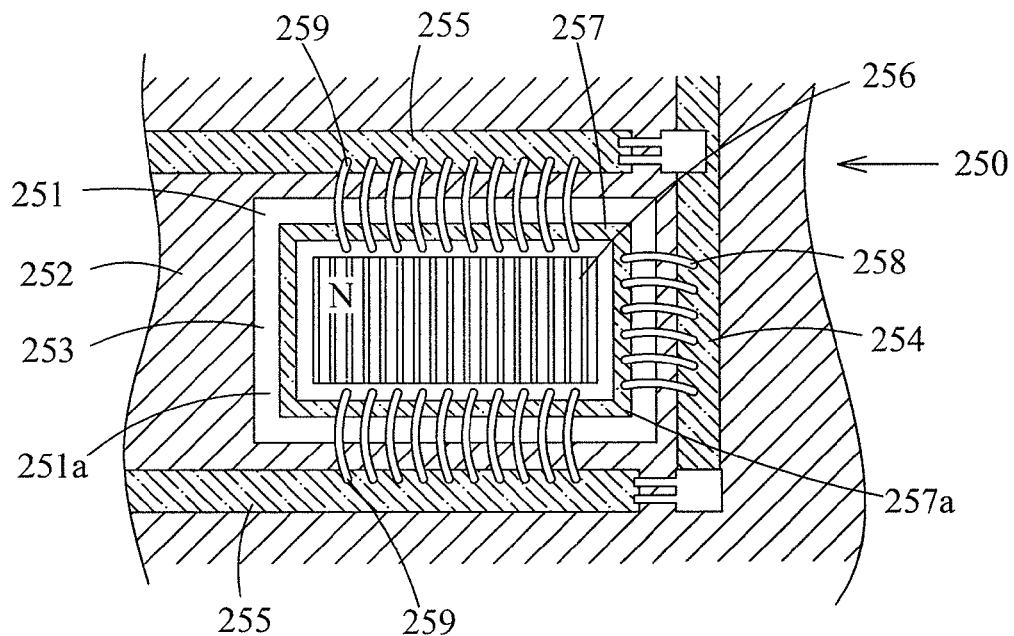
Figure 2F:
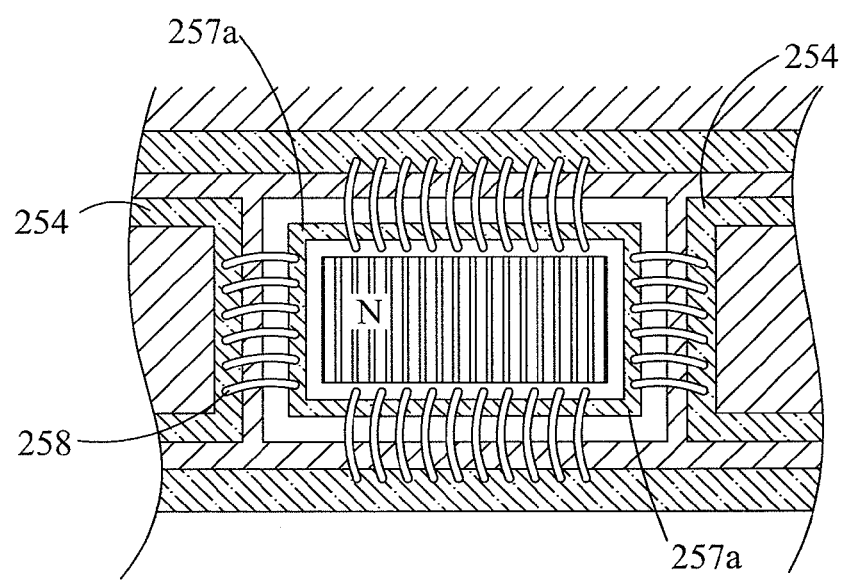

FIGS. 2E and 2F are top views of the electrical connection of a photodiode and a circuit board performed by a wire bonding process in two further embodiments of the present invention. The two further embodiments differ from the preceding embodiments in terms of the arrangement of the first contact pad (for connection with the P-electrode) and the second contact pad (for connection with the N-electrode). Referring to FIG. 2E, a package structure of photodiode 250 comprises: a heat-dissipation plate 251; and a circuit board 252 attached to the heat-dissipation plate 251. The circuit board 252 has an opening 253 for exposing a top surface 251a of the heat-dissipation plate 251, and has a first contact pad 254 and a second contact pad 255 disposed on a peripheral area of the opening 253. The photodiode chip 256 and a carrier 257 thereof are disposed in the opening 253 and attached to the top surface 251a of the heat-dissipation plate 251. The carrier 257 has a metal cladding surface 257a. The photodiode chip 256 is disposed on the carrier 257. The bottom area of the photodiode chip 256 is less than the area of the metal cladding surface 257a such that a portion of the metal cladding surface 257a is exposed. The metal cladding surface 257a thus exposed is electrically connected to the first contact pad 254 through a gold wire 258. The top surface of the photodiode chip 256 is electrically connected to the second contact pad 255 through a gold wire 259. FIG. 2E differs from FIG. 2F in that the latter has one more row of said first contact pad 254 and said gold wire 258 for electrical connection with the exposed metal cladding surface 257a than the former does.

Figure 3A:
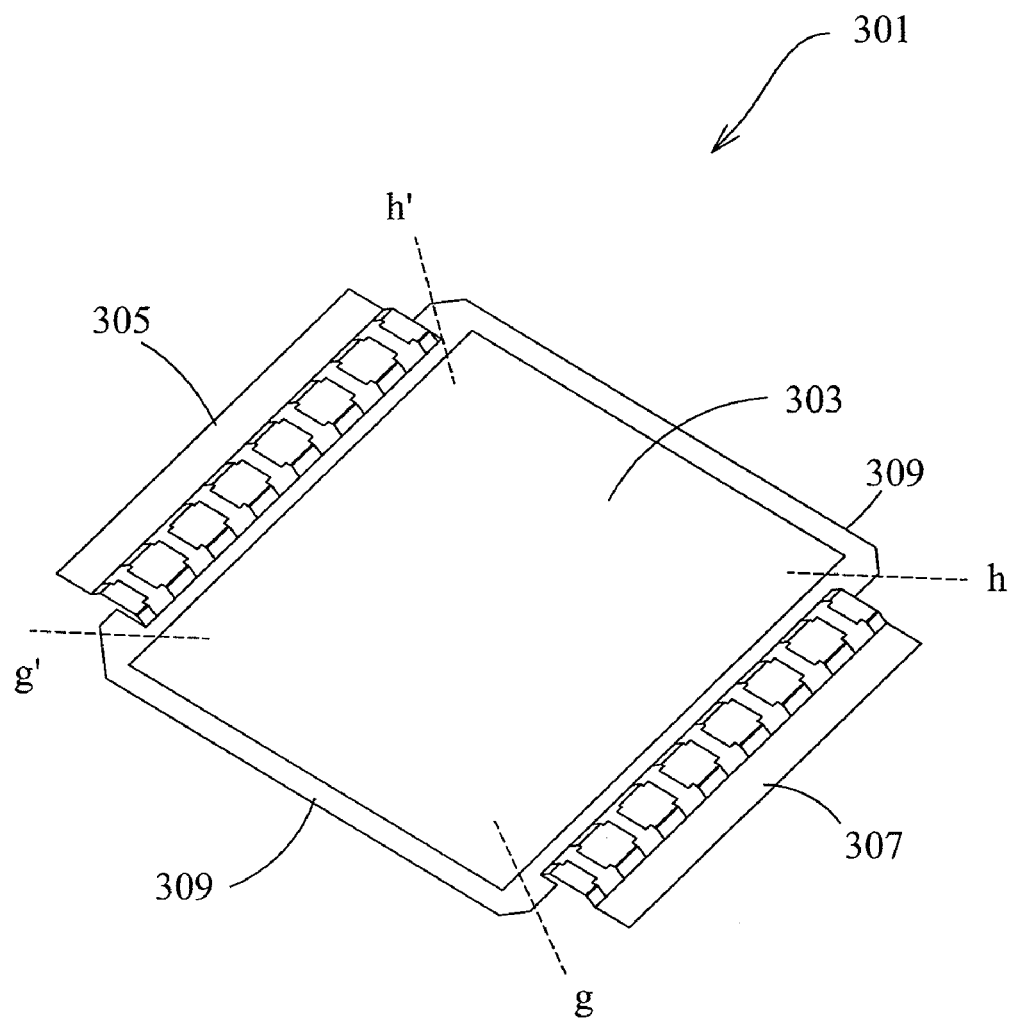
FIG. 3A is a schematic view of a lead frame used in a third embodiment of the present invention.
Figure 3B:
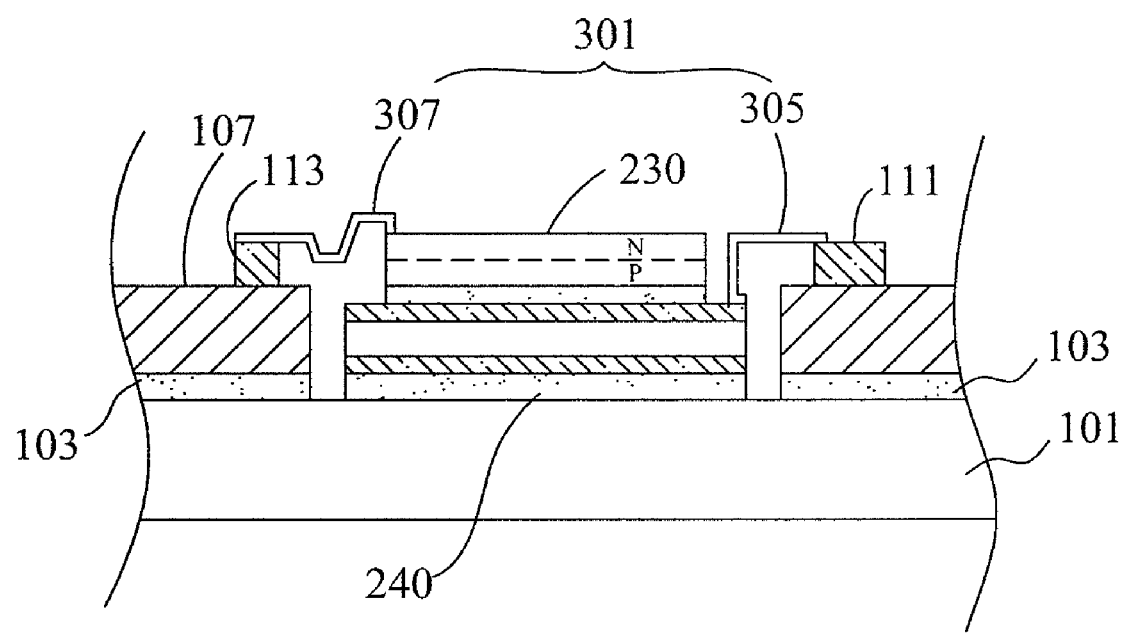
FIG. 3B is a schematic view of the package structure of photodiode according to the third embodiment of the present invention.

FIG. 3A is a schematic view of a lead frame 301 for use in a structure according to the third embodiment of the present invention wherein the gold wire bonding process is not used. The difference between the third embodiment and the first embodiment of the present invention is that, in the third embodiment, the electrically connecting step is performed by means of a lead frame instead of a wire bonding process. Referring to FIG. 3A, the lead frame 301 comprises an opening 303, a first portion 305 for connecting the first contact pad 111 and the exposed metal cladding surface 201a, and a second portion 307 for connecting the second contact pad 113 and the top surface of the photodiode chip 230. The lead frame 301 further includes a redundant portion 309 between g-g' and between h-h', and the redundant portion 309 is removed at an appropriate time during the fabrication process. FIG. 3B is a schematic view of the lead frame 301 coupled to the structure shown in FIG. 2D in accordance to third embodiment of the present invention.

Figure 4A:
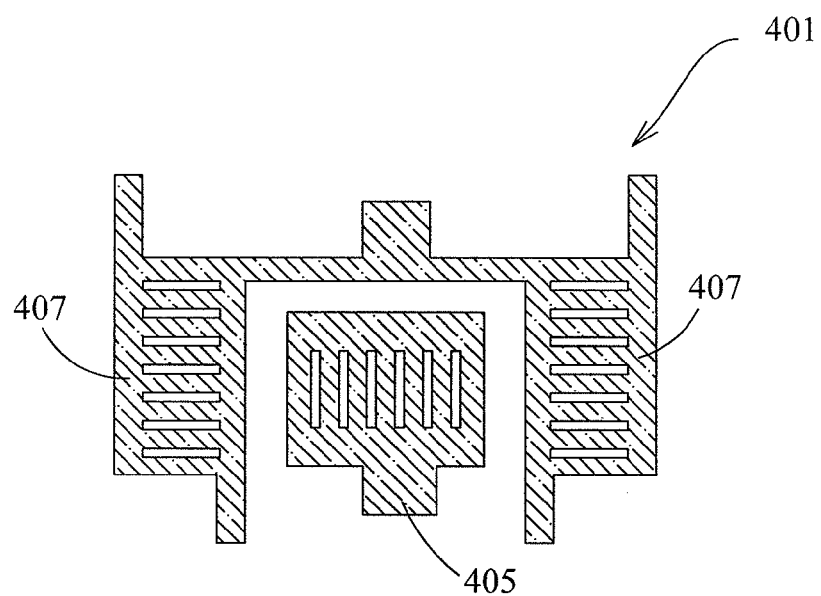
FIGS. 4A and 4B show a lead frame used in a fourth embodiment of the present invention.
Figure 4B:
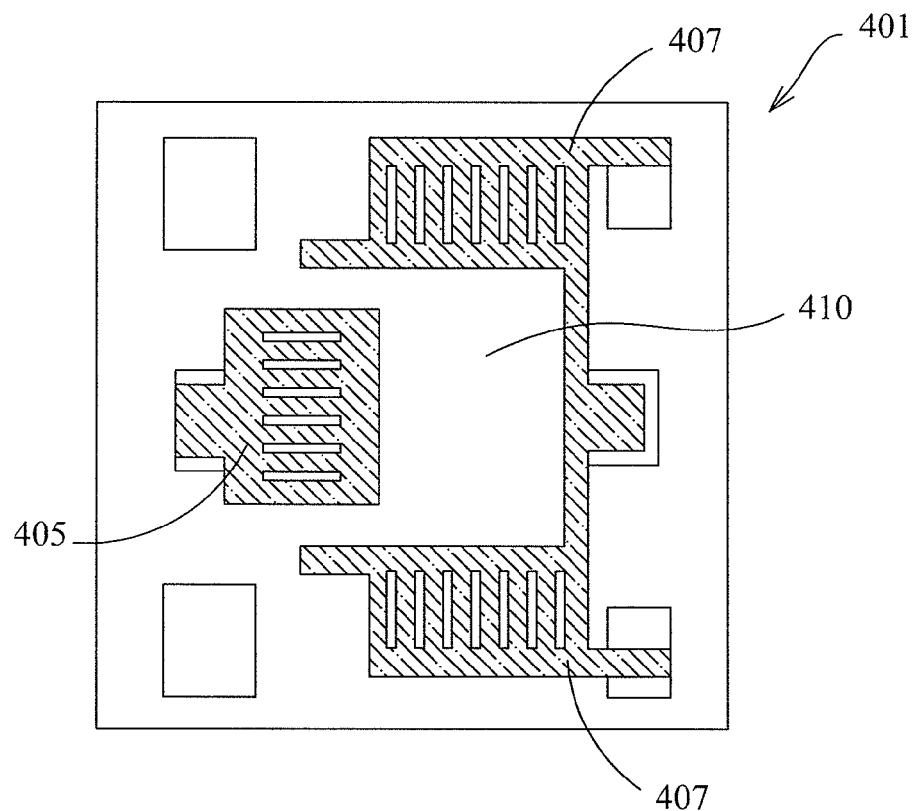
Figure 5:
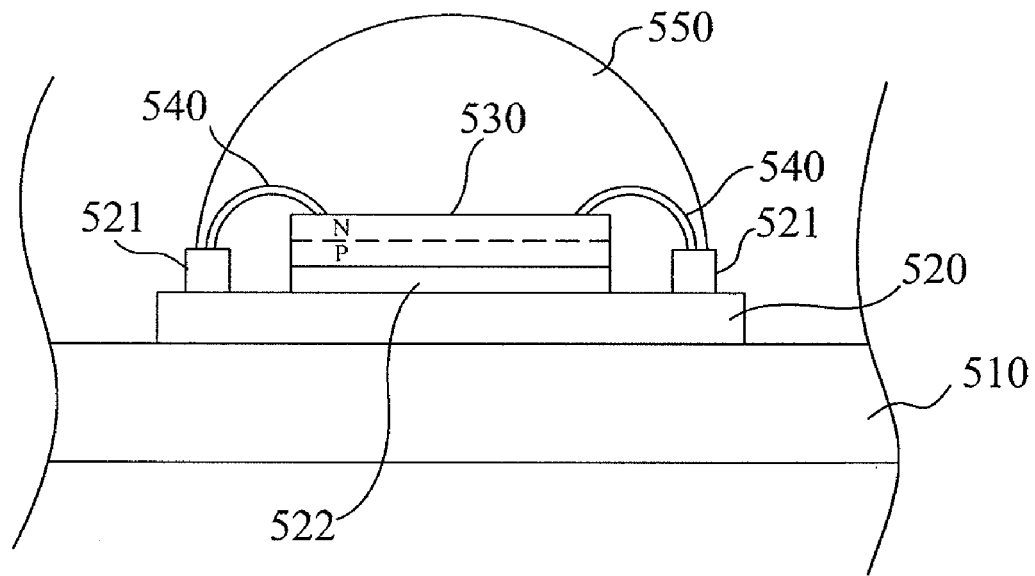
FIG. 5 shows a conventional package structure of photodiode.

Referring to FIG. 4A, there is shown a lead frame 401 for use in the fourth embodiment of the present invention. As shown in FIG. 4A, the lead frame 401 comprises a first portion 405 for connecting the first contact pad and the exposed metal cladding surface, and a second portion 407 for connecting the second contact pad and the top surface of a photodiode chip. The lead frame 401 is appropriately cut and arranged to form the pattern shown in FIG. 4B. The lead frame 401 has an opening 410 for receiving a photodiode chip.

The above-mentioned are only the preferred embodiments of the present invention, but not limiting the claims of the present invention; all the equivalent variation or modification without departing from the spirit disclosed by the present invention should be construed falling within the scope of the following claims.

I claim:
1. A method of forming a package structure of photodiode, the method comprising:
   providing a heat-dissipation plate;
   forming a patterned solder layer on the heat-dissipation plate, wherein the patterned solder layer is for connecting the heat-dissipation plate and a circuit board;
   placing the circuit board on the heat-dissipation plate, the circuit board including:
      an opening exposing a top surface of the heat-dissipation plate; and
      a first contact pad located on a peripheral area of the opening;

placing a carrier having a metal cladding surface into the opening;

placing a photodiode chip on the carrier, wherein the bottom area of the photodiode chip is less than the metal cladding surface such that a portion of the metal cladding surface is exposed;

conducting a single reflow process to solder the circuit board, the heat-dissipation plate, the carrier and the photodiode chip together; and electrically connecting the exposed metal cladding surface to the first contact pad.

2. The method according to claim 1, prior to the step of placing the carrier into the opening, further comprising placing a first solder sheet into the opening, wherein the first solder sheet is for connecting the heat-dissipation plate and the carrier.

3. The method according to claim 2, prior to the step of placing the photodiode chip on the carrier, further comprising placing a second solder sheet on the carrier, wherein the second solder sheet is for connecting the carrier and the photodiode chip.

4. The method according to claim 1, wherein the circuit board further comprises a second contact pad located on the peripheral area of the opening, and the method further comprises electrically connecting the second contact pad to the photodiode chip.

5. The method according to claim 4, wherein the step of electrically connecting is conducted by wire bonding.

6. The method according to claim 4, wherein the step of electrically connecting the second contact pad to the photodiode chip is conducted by a lead frame.

7. The method according to claim 4, further comprising placing a protective diode on the circuit board, the protective diode being connected to the first contact pad and the second contact pad.

8. A method of forming a package structure of photodiode, the method comprising:

providing a heat-dissipation plate;

placing a circuit board on the heat-dissipation plate, the circuit board having an opening exposing a top surface of the heat-dissipation plate and a first contact pad and a second contact located on a peripheral area of the opening;

placing a protective diode on the circuit board, the protective diode being connected to the first contact pad and the second contact pad;

providing a photodiode submount, the photodiode submount including:
   a carrier having a metal cladding surface; and
   a photodiode chip on the carrier, wherein the bottom area of the photodiode chip is less than the metal cladding surface such that a portion of the metal cladding surface is exposed;

placing the photodiode submount into the opening;

conducting a single reflow process to solder the circuit board, the heat-dissipation plate and the photodiode submount together; and electrically connecting the exposed metal cladding surface to the first contact pad.

9. The method according to claim 8, further comprising electrically connecting the second contact pad to the photodiode chip.

10. The method according to claim 8, further comprising placing a glass plate above the circuit board, the glass plate covering the photodiode submount and the protective diode.

11. The method according to claim 9, wherein the step of electrically connecting the second contact pad to the photodiode chip is conducted by a lead frame.

12. The method according to claim 11, wherein the step of electrically connecting the exposed metal cladding surface to the first contact pad is also conducted by the lead frame.

13. The method according to claim 8, wherein the step of electrically connecting the exposed metal cladding surface to the first contact pad is conducted by a lead frame.

14. A method of forming a package structure of photodiode, the method comprising:

providing a heat-dissipation plate;

placing a circuit board on the heat-dissipation plate, the circuit board including:
   an opening exposing a top surface of the heat-dissipation plate; and
   a first contact pad located on a peripheral area of the opening;

placing a carrier having a metal cladding surface into the opening;

placing a photodiode chip on the carrier, wherein the bottom area of the photodiode chip is less than the metal cladding surface such that a portion of the metal cladding surface is exposed; and electrically connecting the exposed metal cladding surface to the first contact pad by a lead frame.

15. The method according to claim 14, wherein the circuit board further comprises a second contact pad located on the peripheral area of the opening, and the method further comprises electrically connecting the second contact pad to the photodiode chip.

16. The method according to claim 15, wherein the step of electrically connecting the second contact pad to the photodiode chip is conducted by a lead frame.

17. The method according to claim 14, further comprising forming a patterned solder layer on the heat-dissipation plate, wherein the patterned solder layer is for soldering the heat-dissipation plate and the circuit board.

18. The method according to claim 17, further comprising prior to the step of placing the carrier into the opening, placing a first solder sheet into the opening, wherein the first solder sheet is for soldering the heat-dissipation plate and the carrier.

19. The method according to claim 18, further comprising prior to the step of placing the photodiode chip on the carrier, placing a second solder sheet on the carrier, wherein the second solder sheet is for soldering the carrier and the photodiode chip.

20. The method according to claim 8, further comprising placing a protective diode on the circuit board, the protective diode being connected to the first contact pad and the second contact pad.

* * * * *